(12) United States Patent
Leibiger et al.

(10) Patent No.: US 6,927,460 B1
(45) Date of Patent: Aug. 9, 2005

(54) METHOD AND STRUCTURE FOR BiCMOS ISOLATED NMOS TRANSISTOR

(75) Inventors: Steven M. Leibiger, Falmouth, ME (US); Ronald B. Hulfachor, Cape Elizabeth, ME (US); Michael Harley-Stead, Portland, ME (US); Daniel J. Hahn, Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/368,253

(22) Filed: Feb. 18, 2003

Related U.S. Application Data
(60) Provisional application No. 60/357,504, filed on Feb. 15, 2002.

(51) Int. Cl.$^7$ .................. H01L 29/76; H01L 23/94; H01L 31/062; H01L 31/113; H01L 31/119
(52) U.S. Cl. .................. 257/378; 257/368; 257/273; 257/272
(58) Field of Search .................. 257/378, 368, 257/272, 273, 324, 517

(56) References Cited

U.S. PATENT DOCUMENTS

| | | | |
|---|---|---|---|
| 5,075,752 A | | 12/1991 | Maeda et al. |
| 5,087,579 A | * | 2/1992 | Tomassetti .................. 438/208 |
| 5,348,907 A | | 9/1994 | Migita |
| 5,374,840 A | | 12/1994 | Arai |
| 5,394,007 A | | 2/1995 | Reuss et al. |
| 5,485,027 A | * | 1/1996 | Williams et al. ............. 257/343 |
| 5,648,281 A | * | 7/1997 | Williams et al. ............. 438/358 |
| 5,731,619 A | | 3/1998 | Subbanna |
| 5,789,286 A | | 8/1998 | Subbanna |
| 5,859,457 A | | 1/1999 | Thiel et al. |
| 5,945,726 A | * | 8/1999 | Prall et al. .................. 257/565 |
| 6,033,946 A | | 3/2000 | Hutter et al. |
| 6,261,932 B1 | | 7/2001 | Hulfachor |
| 6,441,446 B1 | * | 8/2002 | Patti ........................... 257/378 |
| 6,551,869 B1 | * | 4/2003 | Chai et al. .................. 438/204 |

* cited by examiner

*Primary Examiner*—Nathan J. Flynn
*Assistant Examiner*—Victor A. Mandala, Jr.
(74) *Attorney, Agent, or Firm*—Cesari and McKenna, LLP; Edwin H. Paul, Esq.

(57) ABSTRACT

A structure of and a method for making an isolated NMOS transistor using standard BiCMOS processing steps and techniques. No additional masks and processing steps are needed for the isolated NMOS device relative to the standard process flow. A P-type substrate with an overlaying buried N-type layer overlaid with a buried p-type layer below a P-well is shown. An N-type region surrounds and isolates the P-well from other devices on the same wafer. N+ regions are formed in the p-well for the source and drain connections and poly or other such electrical conductors are formed on the gate, drain and source structures to make the NMOS device operational. Parasitic bipolar transistors are managed by the circuit design, current paths and biasing to ensure the parasitic bipolar transistors do not turn on.

7 Claims, 5 Drawing Sheets

METHOD AND STRUCTURE FOR BICMOS ISOLATED NMOS TRANSISTOR

CROSS-REFERENCE TO RELATED APPLICATIONS

The present application claims the benefit of U.S. Provisional Patent Application Ser. No. 60/357,504, which was filed on Feb. 15, 2002, of common title, ownership and inventorship with the present application, and which provisional is hereby incorporated herein by reference.

BACKGROUND OF THE INVENTION

1. Field of the Invention

The present invention relates to BiCMOS processes forming bipolar and CMOS devices on the same wafer under common processing steps, and more particularly to forming isolated NMOS transistors thereon.

2. Background Information

An isolated NMOS transistor is a common electronic semiconductor device found in many product applications and made by a number of fabricators. The P-well of an isolated NMOS is electrically and spatially separated from the P-type substrate by a continuous N-type doping region below and around it, while in contrast the standard NMOS is built within a P-well that is electrically and physically connected to the P-type substrate. Please note that this application does not pertain to any structure or method of making an isolated device using silicon on insulator (SOI) or other similar buried insulator techniques, but is restricted to standard bulk silicon BiCMOS applications.

Isolated NMOS transistors have been constructed in a number of patented ways, some of which are discussed below. These known isolated devices, using BiCMOS processes and structures, use a normal P-well region over a dedicated N-type buried layer that is connected to the surface by a vertical N-type sink. Together, these complete electrical isolation of the P-well by forming an unbroken "bucket" of N-type doping. By dedicated, it is meant that the buried N-type layer is used only for the purpose of P-well isolation and is not incorporated in the other CMOS or bipolar devices on the wafer. This NMOS isolation scheme requires at least one additional mask and associated processing steps, and thus inherently increases fabrication time and costs, and reduces yields and reliability.

The N-type buried layer for an isolated NMOS transistor is often set deep enough to allow entire P-well region to fit above it. By keeping most of the normal P-well intact, including the P-type buried layer, high breakdown voltages and low parasitic transistor gains can be achieved for the isolated NMOS device. The parasitic NPN transistor from the source or drain contact (N-type emitter), through the isolated P-well (P-type base), to the isolation layer (N-type collector) has low gain because of the large base doping and base width. The punch through breakdown between the isolated NMOS P-well and the substrate is large because the N-type isolation layer and isolation sidewalls are made thick and highly doped. The diode between the N-type isolation layer and sidewalls and the substrate can be neutralized by biasing the N-type regions high and grounding the substrate.

U.S. Pat. No. 5,075,752 ('752) to Takeo Maeda et al. describes a common BiCMOS isolated NMOS transistor used as part of a memory cell. FIG. 2J at location R1 shows an isolated NMOS device with a P-type substrate 10, an n-type tub 1, a P-type buried layer 9, P-type layer 16 with N-type collector and drain, 31 and 32. Notice that the N-type tub 1 is formed specifically for the device being made at the location R1 and is not found in the other devices. Also, notice that there is no disclosure of an isolated NMOS transistor constructed in any other fashion except with the special N-type tub.

U.S. Pat. No. 5,394,007 to Reuss et al. describes an isolated well BiCMOS structure that will accommodate an isolated NMOS transistor. However, there are additional buried layers that require extra masks and processing steps, and, so, this patent has similar limitations to the '752 patent.

Other structures that will accommodate BiCMOS isolated NMOS transistors are found in U.S. Pat. Nos. 5,348,907, 5,374,840, 5,731,619, 5,789,286, 5,859,457, and 6,033,946. All of these patents, including those in the two preceding paragraphs are hereby incorporated herein by reference. Each of these patents describes process flows that require dedicated masks and processing steps for the isolated NMOS devices. One reason to use these additional steps and masks is ability to design the NMOS isolation independent of the other, routine electronic devices. This allows the reduction of the parasitic effects and breakdowns, as previously discussed. But, at the same time, there would be the advantage of reduced fabrication costs and process complexity if the isolated NMOS device could be build with the standard process flow.

SUMMARY OF THE INVENTION

The present invention provides for reducing the fabrication costs and cycle time while improving yields for BiCMOS semiconductor products having both isolated NMOS and conventional CMOS and bipolar transistors. The invention is an isolated NMOS transistor on an otherwise unaltered BiCMOS process flow. The N-type buried layer is used for both the buried sub-collector of the NPN and the bottom isolation region of the isolated NMOS device. In this manner there are no addition masks and process steps to form and separate N type buried layer exclusively for the isolated NMOS. The P-well (including the P-type buried layer) resides above the N-type buried layer, although part of the P-type buried layer is lost through compensation by the N-type buried layer. Therefore, such an NMOS structure may exhibit lower breakdown voltages compared to the prior art and the parasitic NPN and substrate diode may divert more current. The present invention compensates for and manages these circumstances by circuit means as described below.

It will be appreciated by those skilled in the art that although the following Detailed Description will proceed with reference being made to illustrative embodiments, the drawings, and methods of use, the present invention is not intended to be limited to these embodiments and methods of use.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
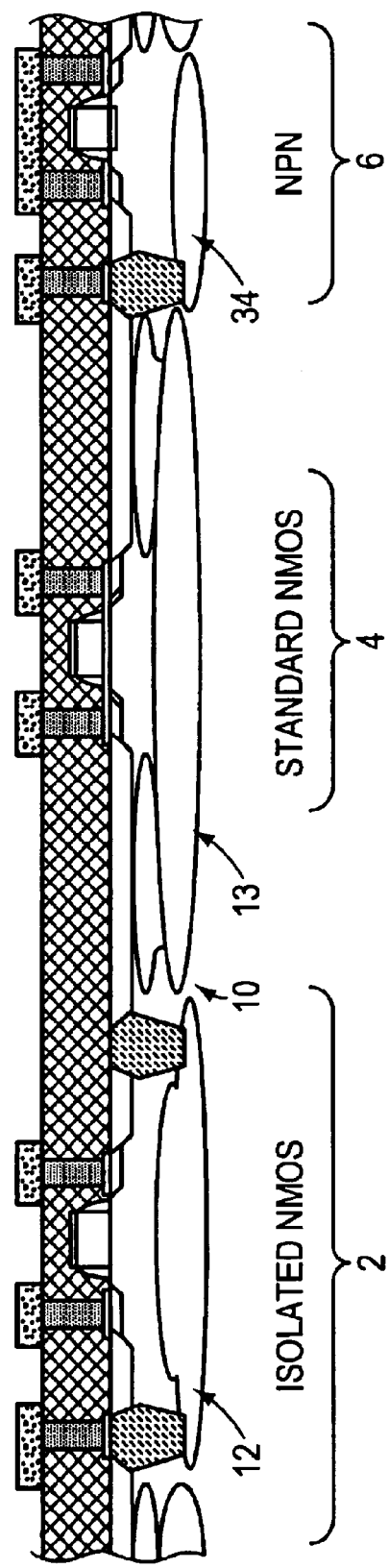
FIG. 1 is a cross section drawing of a BiCMOS chip carrying the inventive device and two standard, non-inventive electronic devices.

FIG. 1 is a cross section vertically through the chip structure containing an isolated NMOS transistor 2, a standard non-isolated NMOS transistor 4 and an NPN transistor 6.

The chip shown in FIG. 1 uses a BiCMOS process for jointly fabricating bipolar devices with CMOS devices. Such a process flow is well understood in the art. Moreover, the steps used to fabricate such a structure are well known in the art. The spacing, sizes, dopants and other photographic, chemical, and mechanical processes, materials and methods for forming the structure of FIG. 1 are those found in typical BiCMOS structures. For example, the specific values can be taken from the above-incorporated patents for the details required to make BiCMOS structures.

The devices are built on a P-type substrate 10 supporting N-type buried layers 12 and 34 of the NPN bipolar device and other devices on the same wafer, see below. A P type buried layer 13 is formed below the standard NMOS transistor 4.

Figure 2:
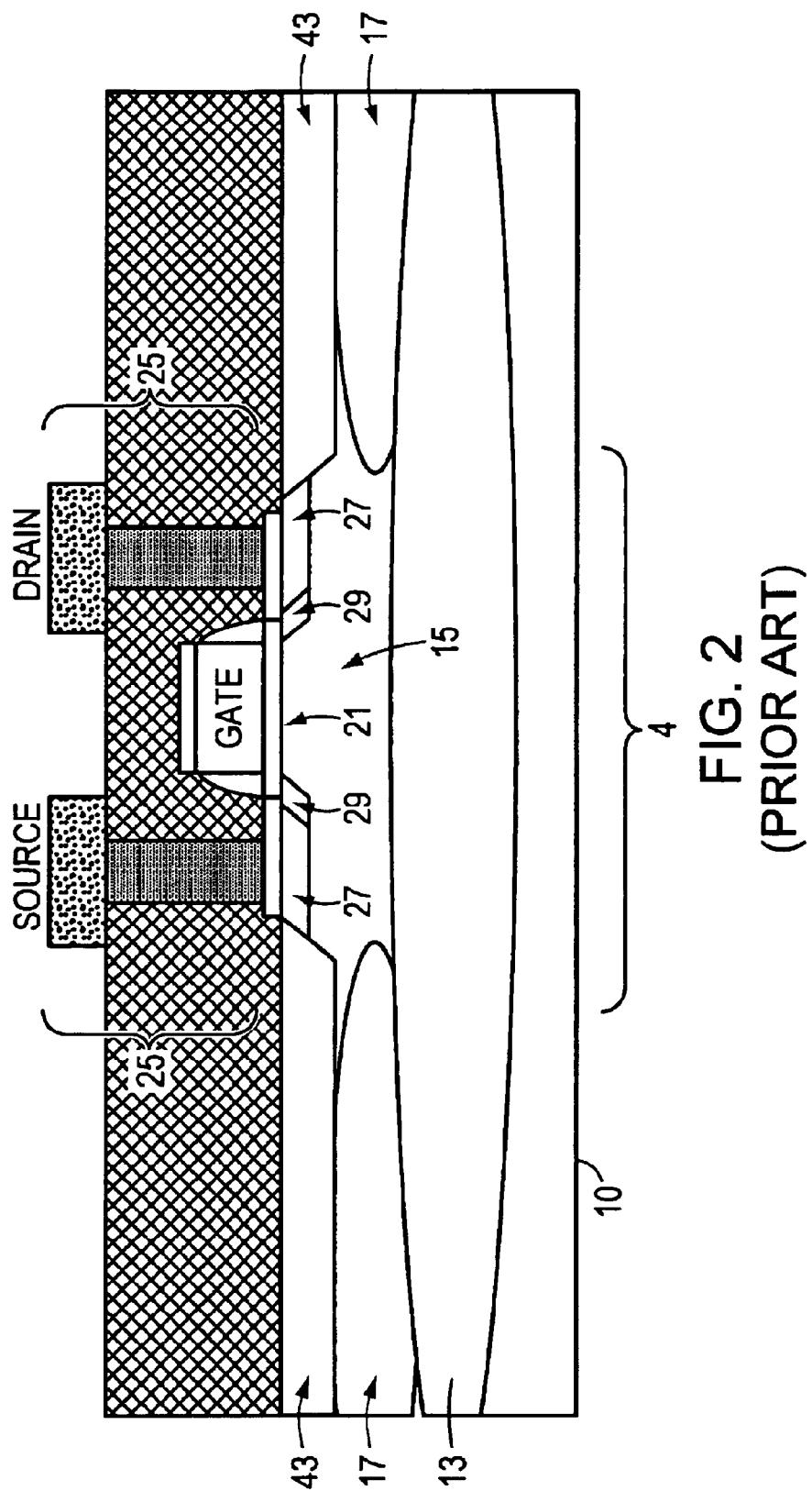
FIG. 2 is a cross section of a non inventive, prior art NMOS.

FIG. 2 shows the prior art standard NMOS transistor in more detail. There is a P+ buried layer 13 with P type channel stops 17 surrounding the device 4. The gate is electrically isolated by a dielectric layer 21 from the P type well 15. The source and drain metal make electrical contacts at the surface poly or metalization to the N+ doped contacts 27 via metal contact plugs, types of silicides, etc. that are well known in the art. The contact stack from the source and the drain connect to N type lightly doped structures 29. In operation, as is well known, an N type channel is formed below the gate between the item 29 structures.

Figure 3:
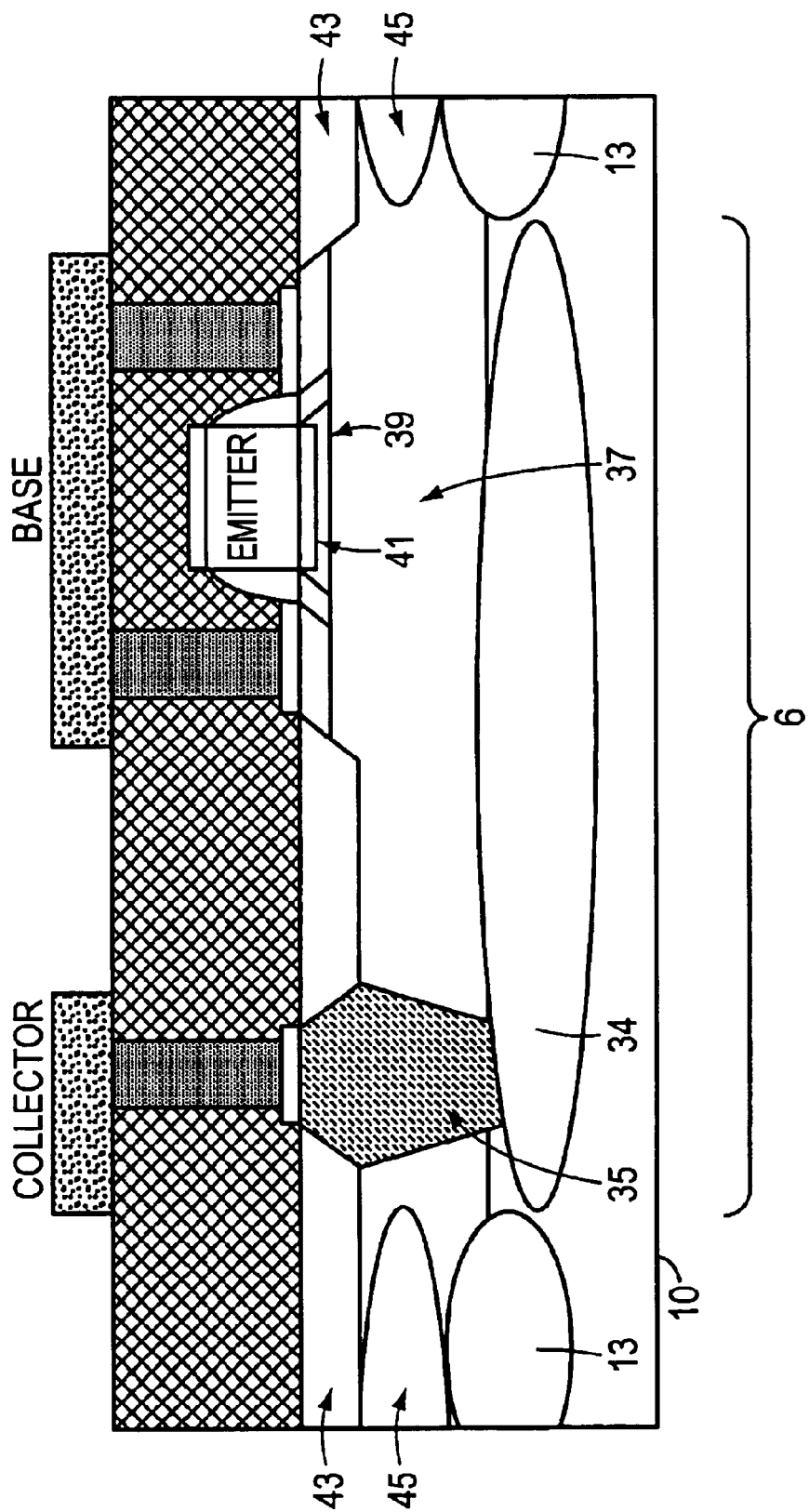
FIG. 3 is a cross section of a bipolar NPN transistor.

FIG. 1 also outlines a bipolar NPN transistor 6 that is shown in more detail in FIG. 3. The collector is in electrical contact via a contact stack similar to that describe above, FIG. 2 item 25, with an N+ sink 35 and an N+ buried layer 34. As discussed above, layer 34 is formed at the same time as the buried layer 12 in the inventive isolated NMOS device shown in more detail in FIG. 4. As typical, there is an emitter connected to an N+ region 41 overlaying an N type epi layer 37, a base connection electrically connected to a P type base regions 39. The NPN is isolated by the field oxide 43, a P channel stop 45, and the P+ buried layer 13 connecting to the P substrate 10.

Figure 4:
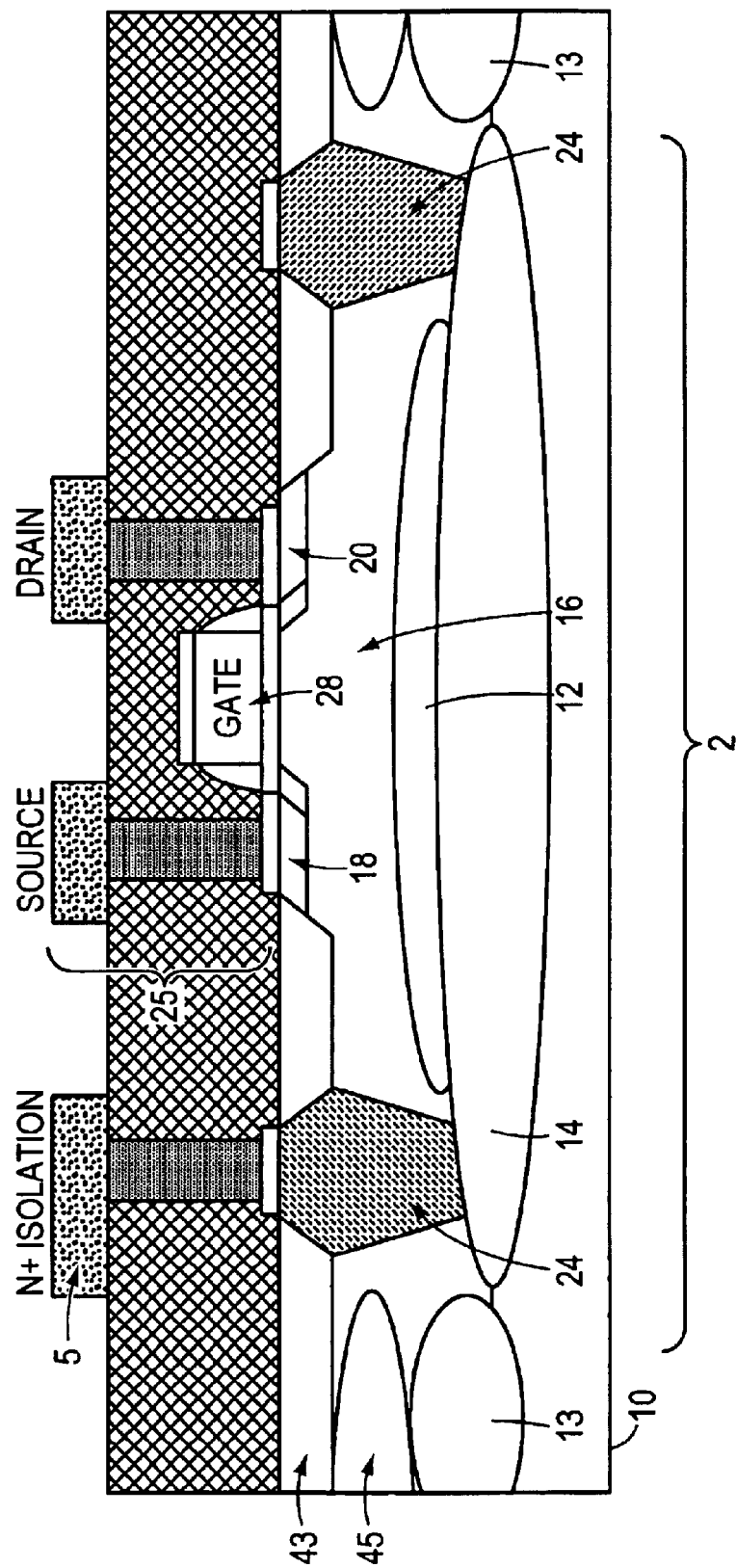
FIG. 4 is a cross section of a inventive NMOS.

FIG. 4 illustrates the inventive isolated NMOS in more detail. A P-well 16 is formed with two N+ regions that will form the source 18 and drain 20 of the NMOS device. There is a vertical N-type sink 24 that joins the N-type buried layer that isolate the P-well of the device from the substrate 10. This structure is electrically connected to the top surface 5 wherein the isolation layer may be biased to support the use of the invention in particular applications. Oxide layers 43 and 26 exists as expected and a patterned and etch poly layer 28 forms the gate electrode. Other electrical connections are made to the N+ regions 18 and 20 via stacks layers of top surface metalization of poly, plugs and silicides similar as described above in FIG. 2, item 25, and as well known in the art. A P-type buried layer is formed top of the N-type buried layer. At the same time other p-type buried layers 13 are formed in parallel with layer 14 and used for other devices being made on the same wafer. This P type buried layer is needed in the isolated NMOS to improve vertical breakdown and reduce parasitic bipolar transistor action discussed below. In this embodiment, the buried layers used to construct an isolated NMOS transistor are those layers that are used to make the other standard devices found on the same wafer. There are no special additional masks and/or process steps exclusive only to the isolated NMOS device. Thus, the isolated NMOS device comes "free" of the additional processing needed in prior art devices.

One aspect of the present invention concerns the parasitic bipolar transistors and the operational parameters of the isolated NMOS devices made using the "standard" processes dispensing with the additional dedicated masks, diffusions, ion implantations for the prior art isolated NMOS devices. As mentioned above, the parasitic devices may have higher betas and lower breakdown levels as compared to the prior art devices.

Figure 5:
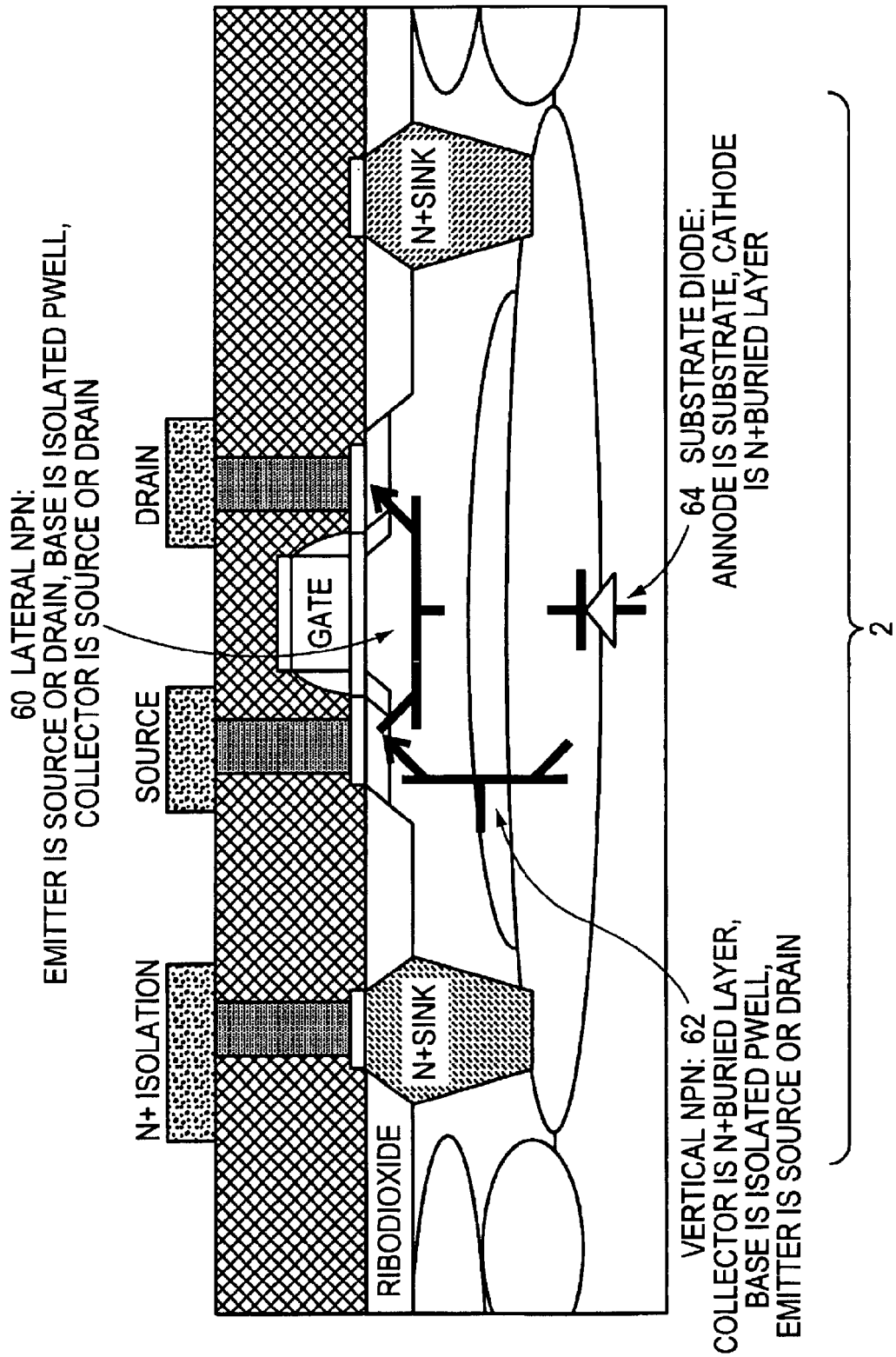
FIG. 5 is a cross section of the inventive device illustrating parasitic bipolar transistors.

FIG. 5 shows the inherent lateral NPN bipolar transistor 60, the vertical NPN bipolar transistor 62, and the substrate diode 64 all superimposed on the inventive isolated NMOS 2. Using a typical 0.5 um BiCMOS process, the beta (current gain) of the lateral NPN might be 5–10, and the beta of the vertical device might be 40–80. Moreover, the isolation breakdown voltage of the isolated NMOS may be too low for many applications. With these limitations in mind, the NPN devices must be kept off or on such that their transport current does not interfere with the intended circuit operation. On way is to keep the device in cut-off mode by preventing a forward bias of more than approximately 0.7 volts across the base-emitter junction. Also, the substrate diode must be kept from injecting current since this may cause the product to latch-up. This can be done by either tying the isolation well to the highest voltage in the circuit, or surrounding the device with substrate ties to collect injected carriers. Note that the lateral parasitic NPN is a device not unique to the isolated NMOS device, so its management is a normal concern for any circuit design using NMOS transistors. Note also, that management of the vertical NPN and the substrate diode is an interdependent task. For example, in one preferred embodiment the N isolation (item 5 FIG. 4) voltage is set to +3.3 volts, a situation that prevents diode current injection, but makes vertical transistor action more likely. In contrast, another preferred embodiment applies ground potential to the N-type isolation region to cut-off the parasitic vertical bipolar device, which in turn makes substrate injection more likely.

What is claimed is:

1. An isolated NMOS transistor made on a die containing conventional bipolar transistors wherein the conventional bipolar transistors define an N+ type buried layer, the isolated NMOS transistor comprising:
   a P-type well,
   means for making an electrical contact to the P-type well, the contact defining a gate of the isolated NMOS transistor,
   two separate N-type areas formed in the P-type well, one N-type area forming the source and the other forming the drain of the isolated NMOS transistor,
   the N+ type buried layer, common to the conventional bipolar transistors, underlying the P-type well,
   a P+ buried layer on top of the N+ type buried layer, and
   N-type areas connecting the N+ type buried layer wherein the combination of the N-type areas and the N+ type buried layer completely surround the P-type well from the substrate of the die.

2. The isolated NMOS of claim 1 wherein the substrate is P-type material.

3. The isolated NMOS of claim 1 further comprising electrical contacts formed on the N-type areas, and a bias voltage connected to and driving the N-type areas and the N+ type buried layer to control the breakdown potentials of the PN junctions formed and the transistor action of the parasitic PNP and NPN junctions.

4. A process for forming an isolated NMOS transistor on a die containing bipolar transistors, wherein the conventional bipolar transistors define an N+ type buried layer, the process comprising the steps of:

forming a P-type well, making an electrical contact to the P-type well, the contact defining a gate of the isolated NMOS transistor, forming two separate N-type areas in the P-type well, one N-type area forming the source and the other forming the drain of the isolated NMOS transistor, forming a N+ type buried layer, common to the conventional bipolar transistors, underlying the P-type well, forming an P+ type buried layer on top of the N+ type buried layer, and forming N-type areas connecting the N+ type buried layer wherein the combination of the N-type areas and the N+ type buried layer completely surround the P-type well from the substrate of the die.

5. The process of claim 4 wherein the substrate is P-type material.

6. The process of claim 4 further comprising the steps of forming electrical contacts on the N-type areas, and electrically biasing the N-type areas and the N+ type buried layer to control the breakdown potentials of the PN junctions formed and the transistor action of the parasitic PNP and NPN junctions.

7. The process of claim 4 wherein the N+ type buried layer is common to the non-isolated conventional NMOS as well as the bipolar transistors.

* * * * *